United States Patent [19]

Powell

[11] Patent Number: 4,661,177

[45] Date of Patent: Apr. 28, 1987

[54] METHOD FOR DOPING SEMICONDUCTOR WAFERS BY RAPID THERMAL PROCESSING OF SOLID PLANAR DIFFUSION SOURCES

[75] Inventor: Ronald A. Powell, Redwood City, Calif.

[73] Assignee: Varian Associates, Inc., Palo Alto, Calif.

[21] Appl. No.: 785,418

[22] Filed: Oct. 8, 1985

[51] Int. Cl.[4] ............................................ H01L 21/383
[52] U.S. Cl. .................................................... 148/189
[58] Field of Search ............... 148/186, 189, 188, 1.5; 219/354

[56] References Cited

U.S. PATENT DOCUMENTS

| | | | |
|---|---|---|---|
| 4,331,485 | 5/1982 | Gat | 148/1.5 |
| 4,356,384 | 10/1982 | Gat | 148/1.5 X |
| 4,417,347 | 11/1983 | Muka et al. | 219/354 X |
| 4,481,406 | 11/1984 | Muka | 219/354 X |
| 4,486,652 | 12/1984 | Muka et al. | 219/354 X |
| 4,511,788 | 4/1985 | Arai et al. | 219/354 X |
| 4,544,418 | 10/1985 | Gibbons | 148/1.5 |
| 4,556,437 | 12/1985 | Molee | 148/189 X |
| 4,566,913 | 1/1986 | Brodsky et al. | 148/1.5 |
| 4,584,026 | 4/1986 | Wu et al. | 148/1.5 |
| 4,585,492 | 4/1986 | Weinberg et al. | 148/1.5 |

*Primary Examiner*—George T. Ozaki
*Attorney, Agent, or Firm*—Stanley Z. Cole; Kenneth L. Warsh

[57] ABSTRACT

Doping of a semiconductor wafer is accomplished by placing the wafer in close proximity to a solid planar dopant source and rapidly heating the combination to a high temperature for a short time in a rapid thermal processing apparatus.

3 Claims, 3 Drawing Figures

METHOD FOR DOPING SEMICONDUCTOR WAFERS BY RAPID THERMAL PROCESSING OF SOLID PLANAR DIFFUSION SOURCES

FIELD OF THE INVENTION

The invention pertains to a method of doping semiconductor wafers by heating a solid planar dopant source in proximity to the wafer, in particular by the method of rapid thermal processing.

BACKGROUND OF THE INVENTION

There are a number of ways to dope semiconductor wafers and form diffused junctions. One method is to use ion implantation. This method has the disadvantage that the ion implantation causes lattice damage which must be annealed out with minimum dopant redistribution in a subsequent process step. Another method uses dopant-containing gaseous sources such as $B_2H_6$, $AsH_4$, $PH_3$, or $POCl_3$ for pre-deposition of a doped layer on the wafer surface followed by a high-temperature drive-in step. Such gaseous dopants are, in general, toxic and corrosive. Attendant complex hardware, such as valves and regulators, is required. Control of gas flow patterns is needed for uniformity across the wafer and throughout a large batch of wafers. Another method entails the use of solid planar diffusion sources interleaved between wafers in a diffusion furnace. A diffusion furnace is not a cost-effective producer of single wafers and cannot be used to anneal wafers on the time scale of 1 to 100 seconds needed for ultra-shallow VLSI junctions. Large wafers (200 mm) are difficult to process at high temperature in diffusion furnaces without plastic deformation and slip. Another method uses an overlying polysilicon layer (implanted or otherwise doped) on single crystal silicon, the polysilicon acting as a dopant source for subsequent drive-in in a subsequent step. This method involves several steps. Also, it is difficult to selectively remove the polysilicon from the crystalline silicon substrate should this be desired. The presence of a thin oxide at the polysilicon/crystalline-silicon interface can dramatically affect reproducible transport of dopant into the silicon substrate. Thus, the many methods of doping in wide practice involve multi-step methods, less than optimal results, dangerous materials or complicated apparatus.

OBJECTS OF THE INVENTION

An object of the invention is to provide a method of doping a semiconductor wafer which does not use dangerous gases.

A further object of the invention is to provide a method which does not require complicated apparatus or multiple-steps.

SUMMARY OF THE INVENTION

The objects of this invention are achieved by the use of the technique of rapid thermal processing (RTP) to simultaneously liberate dopant species from a solid planar diffusion source and to drive this dopant into the heated surface of a semiconductor wafer located in close proximity to the solid source. Solid planar dopant sources were developed for use in conventional, batch diffusion furnaces where annealing times of 20–60 minutes are typically employed. This invention is based on the realization that by use of RTP, such sources can be readily adapted for high-throughput, single-wafer processing and shallow ($X_j < 1000$ Å) junction formation.

The rapid heating of both solid source and wafer and the short anneal cycle time possible by RTP (temperatures of about 800° C.–1200° C. can be reached and maintained for times on the order of 2–200 sec) make this a new and attractive way to form shallow diffused junctions in materials such as crystalline Si or GaAs, and obviates the need for gaseous doping sources such as $PBr_3$, $PH_3$, $POCl_3$, $AsH_4$, etc. In the case of materials which have much larger diffusion coefficients, such as polysilicon, this invention could be used to form uniformly doped layers of high electrical conductivity.

These and further constructional and operational characteristics of the invention will be more evident from the detailed description given hereinafter with reference to the figures of the accompanying drawings which illustrate preferred embodiments and alternatives by way of non-limiting examples.

DESCRIPTION OF THE PREFERRED EMBODIMENTS

Figure 1:
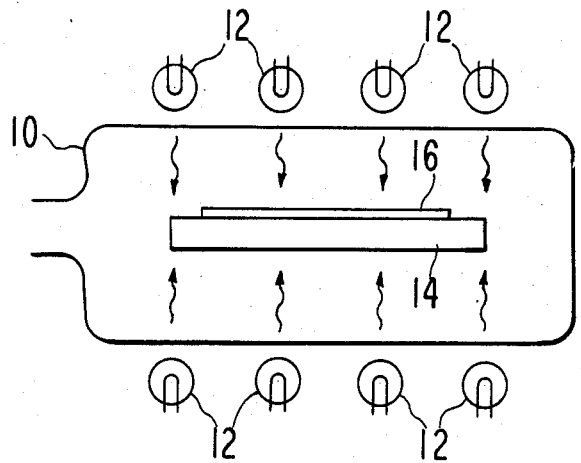
FIG. 1 is a schematic of the apparatus used to practice the invention.
Figure 2:
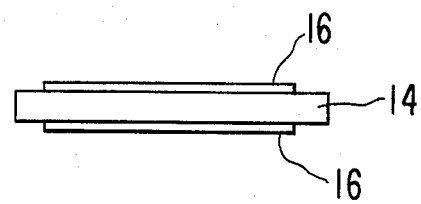
FIG. 2 is a schematic of an alternate embodiment of the arrangement of wafers and dopant source.
Figure 3:
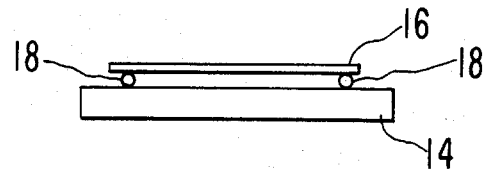
FIG. 3 is a schematic of an alternate embodiment using spacers between the source and the wafer.

The process consists of placing a solid planar diffusion dopant source, for example the PH-1025 phosphorus source made by SOHIO/Carborundum, in close proximity to the wafer to be doped. Both wafer and source are within the chamber of a rapid thermal processor. Either gaseous or vacuum ambients can be used. Referring now to the drawings wherein reference numerals are used to designate parts throughout the various figures thereof, there is shown in FIG. 1 an RTP system 10 using facing arrays 12 of quartz-halogen lamps. Examples of other suitable apparatus includes the Varian IA-200 Isothermal Annealer. Further examples of these annealers can be found in U.S. Pat. Nos. 4,331,485; 4,356,384; 4,417,347; 4,481,406; and 4,486,652. The dopant source 14 is placed in the RTP system 10 and the wafer 16 is placed face down on the source 14. In an alternative arrangement shown in FIG. 2, the dopant source 14 is placed between two wafers 16. In another embodiment shown in FIG. 3, the wafer 16 is again face down on the source 14 but spaced in close proximity by spacers 18; the spacers 18 may be needed for uniformity in some cases or to prevent possible physical damage resulting from contact of devices on the front surface of the wafer with the diffusion source. In all embodiments, the wafer-source combination is subjected to a rapid exposure by the radiation source such that the wafer and source are brought to the desired process temperature ($\geq 1000°$ C.) and held for the appropriate process time (about 2 to 200 sec.)

In the embodiment of FIG. 1, it may be necessary in some cases to apply different power on top and bottom heater arrays so as to heat the source and wafer to different temperatures. This allows additional flexibility and independent control of dopant liberation from the source and drive-in into the semiconductor. The different absorption spectrum of the wafer 16 and the doping source 14 might allow different wavelength irradiation to be used for this purpose.

The short rapid heating cycle time of the invention allows ultra-shallow diffused junctions (less than 1000 Å) to be formed.

In the case of the phosphorus source we have used (PH-1025), glass $P_2O_5$ is the dopant species released and deposited on the wafer surface. In this case, native $SiO_2$ on the substrate before doping does not impede transport of P into the substrate. Also, the dopant overlayer is easily removed in aqueous HF from the Si substrate. The $P_2O_5$ glass overlayer also acts as a cap on the Si or PolySi underlayer, preventing dopant outdiffusions. Such outdiffusion has been observed in RTP from uncapped implanted surfaces.

One-sided doping is achieved since only the side of the wafer facing the source is exposed to the dopant flux.

No lattice damage is created, and the dopant is electrically activated without the need for a subsequent furnace or RTP step, as required after implantation doping, for example.

Selective doping is possible by use of a patterned masking layer such as $SiO_2$, since the dopant diffuses much more slowly into the mask than into the Si below. Open areas in the $SiO_2$ can then be doped. The mask and $P_2O_5$ doping layer can be removed in the same step (e.g., etch in aqueous HF). The mask also keeps the source and wafer from touching, which may be desirable to avoid mechanical damage to devices on the wafer surface or to minimize particulate generation.

Although n-type phosphorus doping sources were used to reduce this invention to practice, p-type dopant sources (for Si) such as boron nitride are also available, allowing bipolar, NMOS and PMOS device fabrication to be addressed by this disclosed invention.

Example: The invention has been practiced by rapidly doping a polysilicon layer using a commercially available solid planar phosphorus diffusion source (Sohio Carborundum Grade PH-1025). In this case, the sample to be doped was 5000 Å thick polysilicon layer deposited by low-pressure chemical vapor deposition onto a Si(100) substrate. The undoped layer had an as-deposited sheet resistance which was too high to measure by four-point probe (>100,000 ohm/sq.). After rapid annealing the source and sample at 1100° C. for 150 sec (using the configuration shown in FIG. 1), the polysilicon sheet resistance dropped to 12.8 ohm/sq.—comparable to the lowest values reported for n+-polysilicon doped using a gaseous $POCl_3$ source in a diffusion furnace.

This invention is not limited to the preferred embodiment and alternatives heretofore described, to which variations and improvements may be made including mechanically and electrically equivalent modifications to component parts, without departing from the scope of protection of the present patent and true spirit of the invention, the characteristics of which are summarized in the following claims.

What is claimed is:

1. A method of diffusing a material into a planar workpiece comprising the steps of:
   inserting a solid planar dopant material source into a rapid thermal processing apparatus,
   placing a planar workpiece in close proximity to said solid planar dopant material source, and
   rapidly heating said solid planar dopant material source and independently rapidly heating said planar workpiece to high temperature for a short period of time in order to diffuse said dopant material into said planar workpiece without introducing process gas.

2. A method as in claim 1 wherein said solid planar dopant material source and said planar workpiece are heated to temperature greater than 800° C.

3. A method as in claim 2 wherein said rapid heating of said solid planar dopant material source takes place in a period of time less than 200 seconds.

* * * * *